United States Patent
Snyder et al.

(10) Patent No.: US 6,800,136 B2
(45) Date of Patent: Oct. 5, 2004

(54) AXIAL GRADIENT TRANSPORT APPARATUS AND PROCESS

(75) Inventors: David W. Snyder, Leechburg, PA (US); William J. Everson, Cabot, PA (US)

(73) Assignee: II-VI Incorporated, Saxonburg, PA (US)

( * ) Notice: Subject to any disclaimer, the term of this patent is extended or adjusted under 35 U.S.C. 154(b) by 106 days.

(21) Appl. No.: 10/221,426

(22) PCT Filed: Mar. 13, 2001

(86) PCT No.: PCT/US01/07966

§ 371 (c)(1),
(2), (4) Date: Sep. 11, 2002

(87) PCT Pub. No.: WO01/68954

PCT Pub. Date: Sep. 20, 2001

(65) Prior Publication Data

US 2003/0037724 A1 Feb. 27, 2003

(51) Int. Cl.⁷ .............................................. C30B 25/04
(52) U.S. Cl. ........................................ 117/106; 117/84
(58) Field of Search ..................................... 117/84, 106

(56) References Cited

U.S. PATENT DOCUMENTS

| | | |
|---|---|---|
| 4,147,572 A | 4/1979 | Vodakov et al. |
| 4,866,005 A | 9/1989 | Davis et al. |
| RE34,861 E | 2/1995 | Davis et al. |
| 5,433,167 A | 7/1995 | Furukawa et al. |
| 5,441,011 A | 8/1995 | Takahaski et al. |
| 5,611,955 A | 3/1997 | Barrett et al. |
| 5,667,587 A | 9/1997 | Glass et al. |
| 5,683,507 A | 11/1997 | Barrett et al. |
| 5,746,827 A | 5/1998 | Barrett et al. |
| 5,788,768 A | 8/1998 | Barrett et al. |
| 5,873,937 A | 2/1999 | Hopkins et al. |
| 6,080,236 A | 6/2000 | McCulloch et al. |

OTHER PUBLICATIONS

A.S. Jordan, R. Caruso, and A.R. Von Neida, "A Thermoelastic Analysis of Dislocation Generation In Pulled GaAs Crystals", The Bell System Technical Journal, p. 593, vol. 59, No. 4, Apr. 1980.

A.S. Jordan A.R. Von Neida, and R. Caruso, "The Theory and Practice of Dislocation Reduction in GaAs and InP", Journal of Crystal Growth, p. 555, vol. 70, 1984.

*Primary Examiner*—Felisa Hiteshew
(74) *Attorney, Agent, or Firm*—Webb Ziesenheim Logsdon Orkin & Hanson, P.C.

(57) ABSTRACT

Disclosed is an apparatus and a method for growing single crystals of materials such as silicon carbide through axial gradient transport. A source of the material (10) is placed at one end of a reaction chamber (2) opposite a seed crystal (13). Separate heating elements (16 and 60; 20 and 62) are positioned at opposite ends of the reaction chamber. The reaction chamber (2) is placed in a growth chamber (26). By appropriately controlling the pressure in the growth chamber (26) and the temperature of the heating elements (16, 20), including the temperature differential therebetween, a uniaxial temperature gradient is generated in the reaction chamber (2). In this manner, planar isotherms are generated and a high quality crystal can be grown through a physical vapor transport process.

24 Claims, 2 Drawing Sheets

AXIAL GRADIENT TRANSPORT APPARATUS AND PROCESS

BACKGROUND OF THE INVENTION

1. Field of the Invention

This invention relates to the growth of large size or diameter, high quality, semiconductor-grade, single crystals of silicon carbide or other materials for optical and electronic device applications.

2. Description of the Prior Art

Single crystals of materials such as silicon carbide (SiC), at least in large sizes or diameters, are often grown in a physical vapor transport (PVT) reactor. All PVT reactors are cylindrical assemblages employing either induction or resistance heating positioned at an outer perimeter of a reaction chamber or reactor. By adjusting the vertical position and power of the heater, an axial temperature gradient is created which causes the sublimation and transport of a material vapor from a material source at the bottom of the reactor to a seed crystal at the top of the reactor. This process forms a single crystal of material, such as SiC, at the top of the reactor. Prior art patents in this area include, for example, U.S. Pat. Nos. 5,683,507; 5,611,955; 5,667,587; 5,746,827; and Re. 34,861.

This known cylindrical reactor design, which heats radially using a cylindrical susceptor/heater, relies on controlled heat losses from the cylinder to create the desired gradient to drive the growth process. These conventional cylindrical PVT reactors create a combination of detrimental radial and axial temperature gradients. This causes numerous problems in the growth of SiC or other crystal materials, including:

- creation of thermal gradients and large thermal stresses in the material boules during growth and during cool-down, leading to the introduction of dislocations and cracking;
- hindering the control of uniform crystal growth rates over time;
- non-uniform source sublimation; and
- severe limitations in scaling up the crystal site beyond the 3–4" diameters to sizes that allow substantial wafer cost reduction.

It is an object of the sent invention to overcome these problems of the prior art designs.

SUMMARY OF THE INVENTION

Accordingly, we have invented an apparatus for producing large size, single crystals in a physical vapor transport reactor. The apparatus includes a reaction chamber having an axis therethrough and configured to receive a source material at a first end and a seed crystal at a second end of the reaction chamber spaced from and opposite the first end. A planar first heating element is positioned outside the reaction chamber, perpendicular to the axis of the reaction chamber and adjacent the source material. In this way, the first heating element is configured to heat the first end of the reaction chamber which receives the source material. Similarly, a planar second heating element is positioned outside the reaction chamber, perpendicular to the axis of the reaction chamber and adjacent the seed crystal. In this manner, the second heating element is configured to heat the second end of the reaction chamber which receives the seed crystal. A heat loss prevention means surrounds the reaction chamber and the first and second heaters for minimizing radial heat loss from the reaction chamber. A growth chamber surrounds the reaction chamber, the first and second heaters and the heat loss prevention means. A heat controller is provided for heating the first and second heating elements to different temperature levels so as to maintain a temperature drop from the first heating element to the second heating element. A vacuum controller is used to establish a desired vacuum in the growth chamber. In this manner, the heat controller and the vacuum controller are operable to provide a uniaxial heat flow from the source material to the seed crystal and planar isotherms so as to establish temperature and vacuum conditions in the reaction chamber to permit high quality crystal growth from the source material to the seed crystal through physical vapor transport.

The first and second heating elements may be induction heating elements each having a susceptor adjacent the reaction chamber and an associated induction coil. The susceptors are both preferably positioned within the growth chamber, although the induction coils of the induction heating elements may be positioned either within or outside the growth chamber. It is also possible to use resistance heaters for the first and second heating elements.

In one embodiment, the heat loss prevention means includes insulation material surrounding the reaction chamber and the first and second heating elements adjacent the reaction chamber. It is also possible to include as a heat loss prevention means a guard heater which surrounds the reaction chamber and extends axially along the length of the reaction chamber. In this embodiment, insulation material would surround the ends of the reaction chamber and the first and second heating elements.

The apparatus can also include a means for cooling the growth chamber. In one embodiment, the growth chamber would include spaced end plates at each end thereof and with cooling liquid, such as cooling water, circulating through the spacing between the spaced end plates at each end.

The heat controller can maintain the first heating element at a temperature of between 2050 and 2300° C., maintain the second heating element at a temperature of between 2000 and 2250° C. and maintain a temperature difference between the heating elements of between 5 and 150° C. In addition, the heat controller can maintain the temperature of the heating elements so as to establish a thermal gradient between the seed crystal and the source material of between 5 and 50° C./cm.

We have also developed a method for producing large size, single crystals in a physical vapor transport reactor. The method includes the steps of placing a quantity of source material at a first location in a reaction chamber, placing a seed crystal in the reaction chamber at a second location therein and spaced from the source material, placing the first as heating element outside the reaction chamber and adjacent the source material, placing a second heating element outside the reaction chamber and adjacent the seed crystal, placing the reaction chamber, with the source material and seed crystal therein, and the first and second heating elements, in a growth chamber, evacuating the reaction chamber to levels suitable for crystal growth, and heating the first and second heating elements to sufficient levels suitable for crystal growth and maintaining a temperature difference between the first heating element and the second heating element to provide a uniaxial heat flow within the reaction chamber from the source material to the seed crystal and to provide planar isotherms so as to permit high quality crystal growth from the source material to the seed crystal through a physical vapor transport process.

Both the apparatus of our invention and the method are particularly suitable for growing SiC from a source material and a seed crystal that are SiC.

A complete understanding of the invention will be obtained from the following description when taken in connection with the accompanying drawing figures wherein like reference characters identify like parts throughout.

DESCRIPTION OF THE PREFERRED EMBODIMENTS

Figure 1:
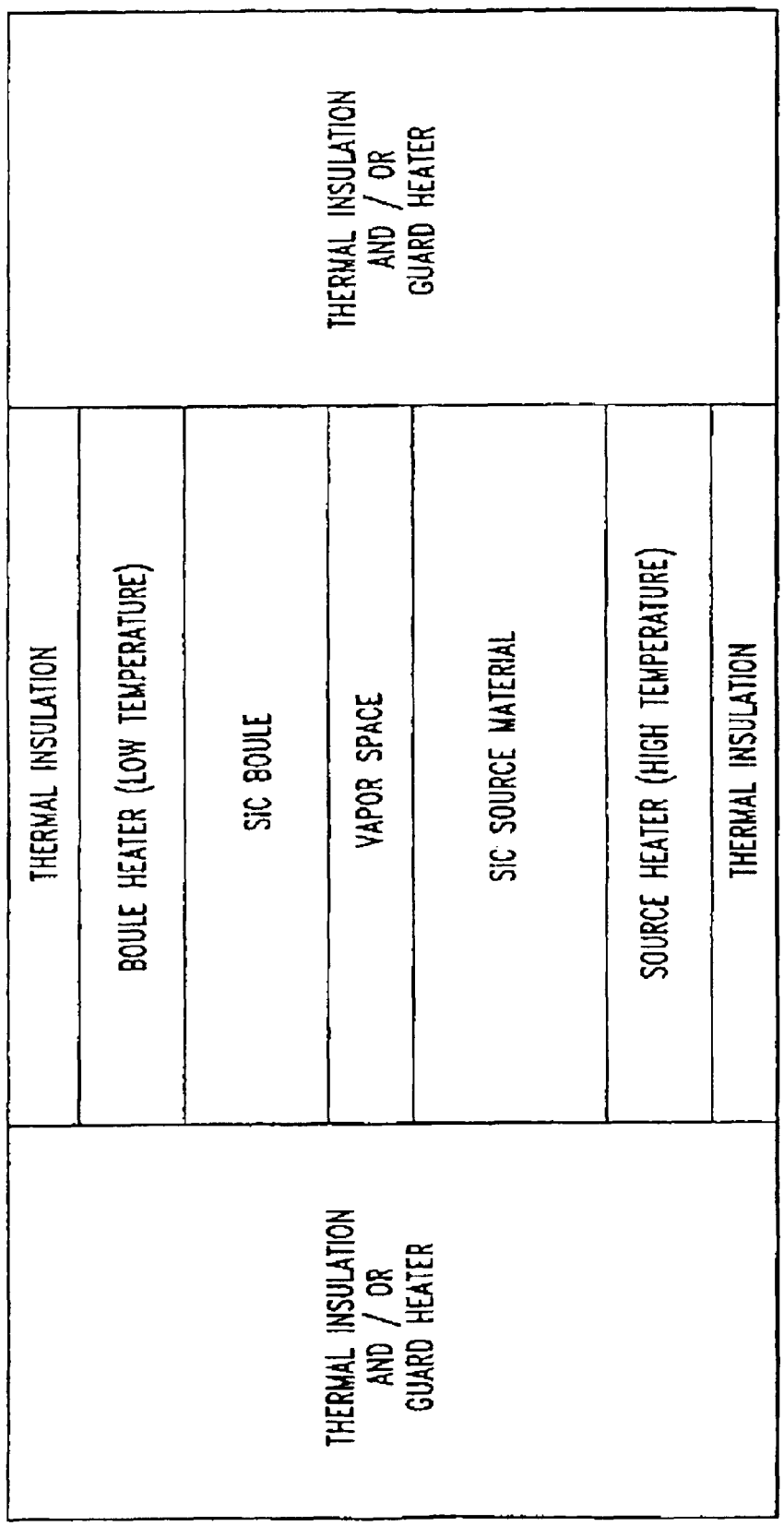
FIG. 1 is a schematic drawing of the concepts included in the axial gradient transport process and apparatus of the present invention.

The present invention uses an axial gradient transport reactor and process to overcome the problems with the prior art designs. FIG. 1 outlines the main features of the present invention in connection with a SiC growth reactor. Although this description focuses on the growth of SiC as the preferred use of the invention, it is to be understood that crystal materials other than SiC can be grown using the present invention.

The present invention overcomes the major thermal limitations of PVT reactors by directly creating a substantially one-dimensional vertical axial temperature gradient from the SiC source material, typically at the bottom of a crucible, to the SiC seed crystal or boule, typically at the top of a crucible. The reactor of the present invention uses two susceptors for induction heating, namely, a high temperature susceptor source beneath the source material as the source heater and a separate low temperature susceptor above the SiC boule for a boule heater. These two susceptors, as powered by their own separate induction elements (not shown in FIG. 1), function to create and control an axial temperature gradient which drives the sublimation/vapor transport/condensation mechanisms for crystal growth in a hot zone from the SiC source material to the SiC boule. Other heating methods, such as resistance heaters, could also be utilized.

In a preferred embodiment, two independent pancake coils, above and below the reactor, inductively heat the adjacent susceptors at the respective upper and lower ends of the reactor. Thick thermal insulation layers and/or guard heaters surround the reactor and suppress radial heat loss from the hot zone and assure the desired axial heat flow.

Figure 2:
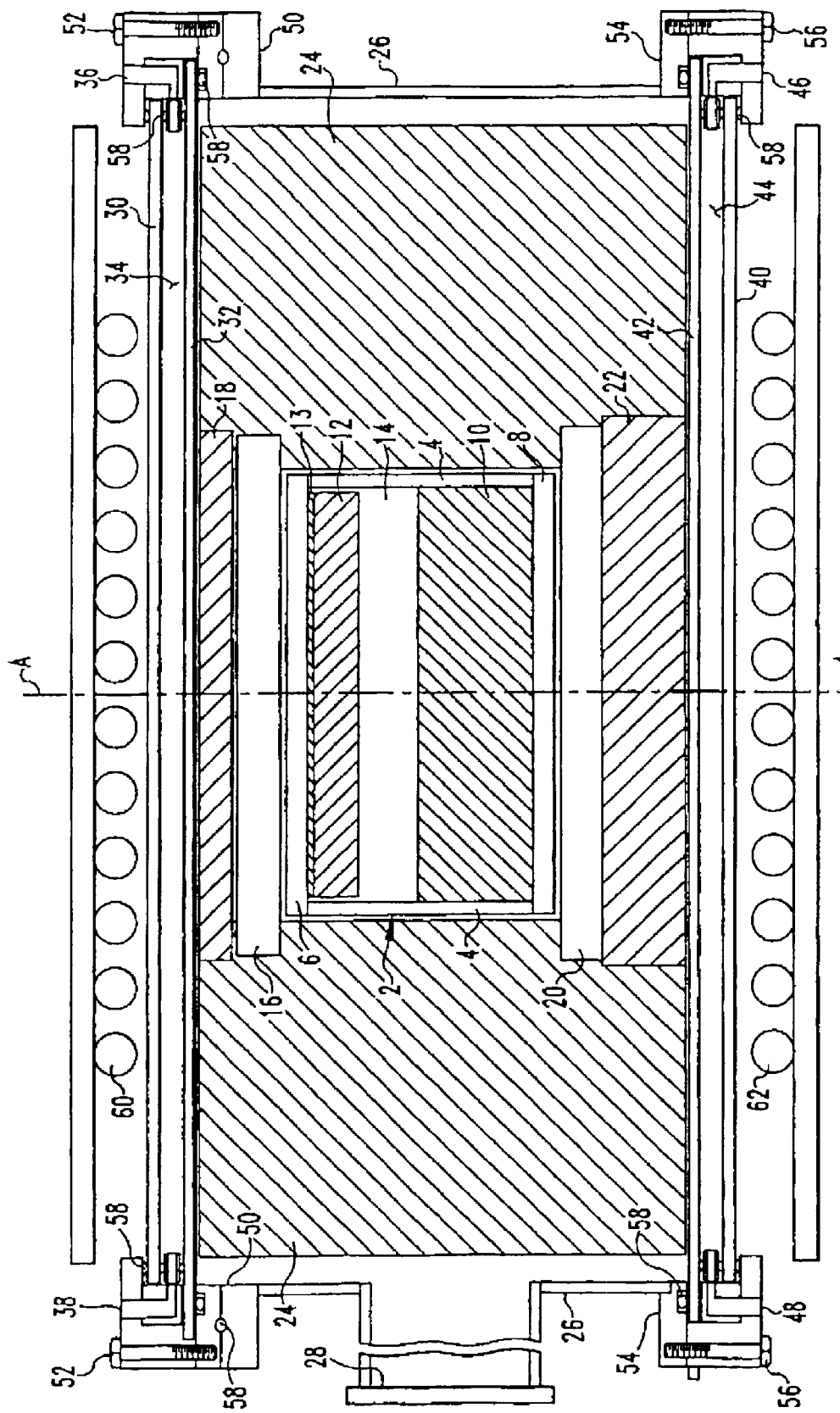
FIG. 2 is a schematic side view of one embodiment of an induction-heated silicon carbide axial gradient transport growth reactor in accordance with the present invention.

One embodiment of a SiC cylindrically shaped growth reactor using the axial gradient transport process of the present invention is shown in FIG. 2. A reaction chamber 2 is formed from a dense graphite cylindrical sleeve or crucible 4 which is closed off by a dense graphite top end plate 6 and a dense graphite bottom end plate 8. A SiC source material 10, which is typically in powder form, is located at a lower end of the reaction chamber 2 and a SiC boule 12 subsequently grown from a seed crystal 13 and from the vaporized and transported source powder 10 moving through a SiC vapor space 14 is formed at an upper end of the reaction chamber 2. A top or low temperature susceptor 16 is positioned above the reaction chamber 2 and a top carbon foam insulation layer 18 is positioned above the top susceptor 16. A bottom or high temperature susceptor 20 is positioned below the reaction chamber 2 and a bottom carbon foam insulation layer 22 is positioned below the bottom susceptor 20. A carbon foam insulation sleeve 24 surrounds the reaction chamber 2, the susceptors 16, 20 and the carbon foam layers 18, 22. This structure is contained in a cylindrical, metal (preferably stainless steel) growth chamber 26 with vacuum tight end plates which are used to contain the graphite parts of the reaction chamber 2 (crucible 4 and end plates 6, 8) that form the reactor hot zone for growth and to establish the vacuum (through a vacuum port 28) needed to sublime the SiC source material 10. While in one embodiment the end plates are fused quartz, other suitable materials can be used.

The end plates for the growth chamber 26 can include, at both the top and the bottom, spaced inner and outer end plates with a cooling water channel therebetween and supplied with cooling water from an injector in fluid communication with the cooling water channel. In particular, the top or low temperature end of the growth chamber 26 shown in FIG. 2 is closed off by a top outer quartz end plate 30 and a top inner quartz end plate 32 spaced apart from each other to form a top cooling water channel 34 therebetween. Water flows from a top cooling water injector 36 and through the top cooling water channel 34 to a top cooling water outlet 38. Similarly, the bottom or high temperature end of the growth chamber shown in FIG. 2 is closed off by a bottom outer quartz end plate 40 and a bottom inner quartz end plate 42 spaced apart from each other to form a bottom cooling water channel 44 therebetween. Water flows from a bottom cooling water injector 46 and through the bottom cooling water channel 44 to a bottom cooling water outlet 48. A top flange 50, surrounding the top end of the growth chamber 26 on its outer surface thereof, permits the top end plates 30, 32, the top water injector 36 and the top water outlet 38 to be removably attached to the growth chamber 26 by bolts 52 or the like. Similarly, a bottom flange 54 surrounding the bottom end of the growth chamber 26 on its outer surface thereof permits the bottom end plates 40, 42, the bottom water injector 46 and the bottom water outlet 48 to be removably attached to the growth chamber 26 by bolts 56 or the like. The various end plates 30, 32, 40, 42, the water injectors 36, 46 and the water outlets 38, 48 may be tightly sealed to the growth chamber 26 in a watertight manner through various O-ring seals 58 as is well-known in the art.

A top or low temperature induction coil 60 is placed above the growth chamber 26 and parallel to the top susceptor 16. A bottom or high temperature induction coil 62 is placed below the growth chamber 26 and parallel to the bottom susceptor 20. Although the induction coils 60, 62 are shown external of the vacuum and outside the growth chamber 26 in FIG. 2, they could be placed within the vacuum and inside the growth chamber 26. This internal arrangement may eliminate coupling losses due to interaction with the top and bottom flanges 50, 54, and permit the use of thinner quartz end plates. The susceptors 16, 18 and induction coils 60, 62 are generally perpendicular to a central axis A extending through the reaction chamber 2.

Through the present invention, a substantially unidirectional axial heat flow is achieved in the source, the reaction zone (SiC vapor space) and the growing crystal (boule), thus achieving large, high quality SiC crystals. This results from heating the reaction chamber from the ends rather than heating cylindrical vertical surfaces of the reaction chamber, and by minimizing radial heat loss from the growth zone. This reduction or elimination of radial temperature gradients has numerous major advantages, including:

boule growth is readily scalable to large diameters;

low crystal thermal stresses in the boules lead to low defect densities in wafers sliced from the boules;

a low thermal stresses during heat-up and cool-down reduce boule cracking;

uniform temperatures greatly improve efficiency and control of source utilization; and uniform temperatures enable precise control of growth rate and seed nucleation.

The present invention will lead to a substantial reduction in the cost per unit area of SiC semiconductor wafers, as well as a major increase in wafer quality by reducing or even eliminating the density of micro-pipes and dislocations, which are the two main device degrading defects. The present invention is a significantly improved form of physical vapor transport crystal growth for SiC or other materials which will result in crystals that have a large size or diameter, are chemically uniform, and have a low defect density.

A typical process sequence may include the following steps. The top reactor end plate or cover is removed and a suitable SiC source material is loaded into the graphite crucible or reaction chamber. It is understood that the SiC source may be SiC powder, a solid piece of SiC or other sources of its constituents, Si and C. A SiC seed crystal is attached to a suitable holder and assembled with the rest of the graphite crucible components to form the "hot zone" for crystal growth. The stainless steel reactor is sealed by a top cover or end plate of a suitable vacuum-tight, insulating material such as fused quartz Conventional O-ring seals are a common method to achieve the seal. Other materials besides quartz may be used for the cover, depending on whether induction heating or some other heating means is employed. The reactor is evacuated to approximately 10 torr and heated above 1000° C. to bake the graphite parts and remove nitrogen and other impurities. In common practice, the chamber is backfilled with argon or a doping gas, e.g., nitrogen, or gas mixtures. A temperature difference is established between the SiC source (hotter) and seed (cooler), and the reactor pressure is reduced in a controlled fashion to initiate and continue growth.

Typically, the source temperature is set at a specific temperature between 2100 and 2200° C. or 2050 and 2300° C. and the seed at a temperature between 2050 and 2150° C. or 2000 and 2250° C. to establish a gradient of 10 to 30° C./cm or 5 to 50° C./cm. These conditions are not limiting. The process may be optimized with respect to pressure, temperature and gradient to achieve high quality growth for a particular SiC polytype (crystal form). Typically, the process will operate most efficiently within the temperature range of 1900 to 2300° C., the pressure range of 2 to 30 torr, and a temperature gradient of 5 to 50° C./cm, although the specific values are generally fixed by experimental optimization. In the axial gradient transport of the present invention, the reactor is designed to produce a nearly axial temperature gradient to minimize stress generation and defects in the crystal and to promote uniform transport.

Heating may be by induction, by resistance or by a combination of sources, although induction heating is the currently preferred approach. Under a given set of conditions, a SiC crystal will grow by the sublimation of the SiC source, transport of SiC gaseous species, and subsequent deposition on the seed crystal which acts as a template to control the polytype and enhance single crystal formation. When the source is substantially exhausted, growth is stopped, the formed crystal or boule is cooled to room temperature over a several hour period and it is removed from the reactor for further processing.

In accordance with the present invention, it is possible to grow large size, or large diameter, single crystals of SiC by vapor transport in which a substantially uniaxial heat flow is imposed along crystal growth direction to create a thermal environment including essentially planar isotherms in the vapor and the growing crystal which promotes low thermalelastic stress generation and reduced defect creation in the crystals, uniform vapor species transport in the growth reactor, and the production of large diameter crystals of such as three inches in diameter or greater.

In accordance with this invention, the SiC source material can be formed of solid crystalline disks which may be in pure form, or may be doped with impurities to add benefit of the use of single crystalline SiC as a solid state optical or electrical device. The SiC source material may be formed as a particulate matter, as a powdered source, or as a grain size smaller than a solid disk. In addition, the SiC source material may be formed of silicon melted to form a liquid and a source of carbon, either gaseous or solid.

Single crystalline SiC materials of a specified polytype impurity could be provided as the seed for deposition of SiC vapor species to form a single crystal. In addition, a crystallographically oriented SiC material could be provided for deposition of a SiC species to form a single crystal.

It is possible to combine the present invention with a carbon disk having a plurality of holes and located above the container of the source material in the reaction chamber. This carbon disk would serve to restrain residual particulate solid source matter from moving through the vapor and contact the growing crystal, thereby causing deleterious secondary grains to form, or which acts as an additional source of carbon to provide for the generation of such vapor species of $SiC_2$, $Si_2C$ and C needed for growth. In addition, a suitable system could be used in conjunction with the growth furnace to introduce an electrically-active doping element during the growth, such as nitrogen or aluminum, in order to control the electronic properties of the crystals for device applications. In addition, it is contemplated to introduce during the growth process a suitable doping element chosen from the periodic table to confer semi-insulating characteristics on the subsequently formed single crystal in order to make it suitable for certain device applications, such as microwave transistors. Overall, the method and apparatus of the present application could be used to produce large, single polytype, SiC single crystals, with or without doping, to fabricate electronic, optical and optoelectronic devices, synthetic gemstones, or custom ceramic components.

Although the present invention has been described in detail in connection with the discussed embodiments, various modifications may be made by one of ordinary skill in the art without departing from the spirit and scope of the present invention. Therefore, the scope of the present invention should be determined by the attached claims.

We claim:

1. A method for producing large size, single crystals in a physical vapor transport reactor, said method comprising the steps of:
   (a) placing a quantity of source material at a first location in a reaction chamber;
   (b) placing a seed crystal in the reaction chamber at a second location therein and spaced from the source material;
   (c) placing a first heating element outside the reaction chamber and adjacent the source material;
   (d) placing a second element outside the reaction chamber and adjacent the seed crystal;
   (e) placing the reaction chamber, with the source material and seed crystal therein, and the first and second heating elements, in a growth chamber;
   (f) evacuating the growth chamber to levels suitable for crystal growth; and (g) heating the first and second heating elements to sufficient levels suitable for crystal growth, and maintaining a temperature difference between the first heating element and the second heating element to provide a uniaxial heat flow within the reaction chamber from the source material to the seed crystal and to provide planar isotherms so as to permit high quality crystal growth from the source material to the seed crystal through a physical vapor transport process.

2. The method of claim 1 wherein the source material and the seed crystal are silicon carbide and the method produces large size, single crystals of silicon carbide.

3. The method of claim 2 wherein the growth chamber is evacuated to between 2 and 30 torr.

4. The method of claim 1 further including the step of surrounding the reaction chamber with a heat prevention means for minimizing radial heat loss from the reaction chamber.

5. The method of claim 4 wherein the heat loss prevention means includes insulation material surrounding the reaction chamber and first and second heating elements adjacent thereto.

6. The method of claim 4 wherein the heat loss prevention means includes a guard heater surrounding the reaction chamber and extending axially along the length of the reaction chamber, and insulation material surrounding the ends of the reaction chamber and the first and second heating elements.

7. The method of claim 1 wherein the first and second heating elements are each induction heating elements having a susceptor adjacent the reaction chamber and an associated induction coil.

8. The method of claim 7 wherein the susceptors and the induction coils of the induction heating elements are all positioned within the growth chamber.

9. The method of claim 7 wherein the susceptors of the induction heating elements are positioned within the growth chamber and the induction coils are positioned outside the growth chamber.

10. The method of claim 1 wherein the temperature of the first heating element is maintained at between 2050 and 2300° C., the temperature of the second heating element is maintained at between 2000 and 2250° C., and a temperature difference between the heating elements is maintained at between 5 and 150° C.

11. The method of claim 1 wherein the temperature of the heating elements is maintained so as to establish a thermal gradient between the seed crystal and the source material of between 5 and 50° C. per centimeter.

12. An apparatus for producing large size, single crystals in a physical vapor transport reactor, said apparatus comprising:

(a) a reaction chamber having an axis therethrough and configured to receive a source material at a first end thereof and a seed crystal at a second end of the reaction chamber spaced from and opposite the first end;

(b) a planar first heating element positioned outside the reaction chamber, perpendicular to the axis of the reaction chamber and adjacent the source material, such that the first heating element is configured to heat the first end of the reaction chamber which receives the source material;

(c) a planar second heating element positioned outside the reaction chamber, perpendicular to the axis of the reaction chamber and adjacent the seed crystal, such that the second heating element is configured to heat the second end of the reaction chamber which receives the seed crystal;

(d) a heat loss prevention means surrounding the reaction chamber and first and second heaters for minimizing radial heat loss from the reaction chamber;

(e) a growth chamber surrounding the reaction chamber, first and second heaters and heat loss prevention means;

(f) a heat controller for heating the first and second heating elements to different temperature levels so as to maintain a temperature drop from the first heating element to the second heating element; and (g) a vacuum controller for establishing a desired vacuum in the growth chamber, such that the heat controller and the vacuum controller are operable to provide a uniaxial heat flow from the source material to the seed crystal and planar isotherms so as to establish temperature and vacuum conditions in the reaction chamber to permit high quality crystal growth from the source material to the seed crystal through physical vapor transport.

13. The apparatus of claim 12 wherein the first and second heating elements are each induction heating elements having a susceptor adjacent the reaction chamber and an associated induction coil.

14. The apparatus of claim 13 wherein the susceptors and the induction coils of the induction heating elements are all positioned within the growth chamber.

15. The apparatus of claim 13 wherein the susceptors of the induction heating elements are positioned within the growth chamber and the induction coils are positioned outside the growth chamber.

16. The apparatus of claim 12 wherein the first and second heating elements are each resistance heaters.

17. The apparatus of claim 12 wherein the heat loss prevention means includes insulation material surrounding the reaction chamber and first and second heating elements adjacent thereto.

18. The apparatus of claim 12 wherein the heat loss prevention means includes a guard heater surrounding the reaction chamber and extending axially along the length of the reaction chamber, and insulation material surrounding the ends of the reaction chamber and the first and second heating elements.

19. The apparatus of claim 12 further including means for cooling the growth chamber.

20. The apparatus of claim 19 wherein the growth chamber includes spaced end plates at both an upper and lower end thereof and wherein the apparatus includes means for circulating cooling liquid in the spacing between the spaced end plates at the upper and lower ends.

21. The apparatus of claim 12 wherein the heat controller maintains the first heating element at a temperature of between 2050 and 2300° C., maintains the second heating element at a temperature of between 2000 and 2250° C., and maintains a temperature difference between the heating elements of between 5 and 150° C.

22. The apparatus of claim 21 wherein the heat controller maintains the temperature of the heating elements so as to establish a thermal gradient between the seed crystal and the source material of between 5 and 50° C. per centimeter.

23. The apparatus of claim 12 wherein the large size, single crystals are silicon carbide.

24. The apparatus of claim 12 wherein the vacuum in the growth chamber is between 2 and 30 torr.

* * * * *

UNITED STATES PATENT AND TRADEMARK OFFICE
CERTIFICATE OF CORRECTION

PATENT NO.    : 6,800,136 B2
DATED         : October 5, 2004
INVENTOR(S)   : Snyder et al.

It is certified that error appears in the above-identified patent and that said Letters Patent is hereby corrected as shown below:

Title page,
After "[65] Prior Publication Data", insert
-- [60]   Related U.S. Application Data
Provisional application No. 60/188,793, filed on March 13, 2000 --
Item [57], ABSTRACT,
Line 8, "controlling the pressure" should read -- controlling the vacuum --

Column 2,
Line 50, "as heating element" should read -- heating element --

Signed and Sealed this

Twenty-sixth Day of April, 2005

JON W. DUDAS
*Director of the United States Patent and Trademark Office*